United States Patent
Lai et al.

(10) Patent No.: US 9,425,343 B2
(45) Date of Patent: Aug. 23, 2016

(54) MECHANISMS FOR FORMING IMAGE SENSOR DEVICE

(71) Applicant: Taiwan Semiconductor Manufacturing Co., Ltd., Hsin-Chu (TW)

(72) Inventors: Chih-Yu Lai, Tainan (TW); Cheng-Ta Wu, Chiayi County (TW); Yeur-Luen Tu, Taichung (TW); Chia-Shiung Tsai, Hsin-Chu (TW); Jhy-Jyi Sze, Hsin-Chu (TW); Shyh-Fann Ting, Tainan (TW); Ching-Chun Wang, Tainan (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 9 days.

(21) Appl. No.: 14/016,996

(22) Filed: Sep. 3, 2013

(65) Prior Publication Data
US 2015/0060964 A1    Mar. 5, 2015

(51) Int. Cl.
*H01L 27/146* (2006.01)
*H01L 31/18* (2006.01)

(52) U.S. Cl.
CPC .......... *H01L 31/18* (2013.01); *H01L 27/14614* (2013.01); *H01L 27/14643* (2013.01)

(58) Field of Classification Search
CPC ............... H01L 27/14643; H01L 27/14601; H01L 27/14625; H01L 27/14645; H01L 27/14647; H01L 27/14831; H01L 27/146; H01L 27/14649; H01L 27/14652; H01L 27/14875; H01L 31/18; H01L 31/0232; H01L 31/02327
USPC ............................................. 257/72, 290–292
See application file for complete search history.

(56) References Cited

U.S. PATENT DOCUMENTS

| | | | |
|---|---|---|---|
| 2010/0108864 A1* | 5/2010 | Ohta et al. | 250/214.1 |
| 2010/0120190 A1* | 5/2010 | Yi et al. | 438/59 |
| 2011/0186918 A1* | 8/2011 | Sung | H01L 21/76224 257/292 |
| 2013/0076934 A1* | 3/2013 | Maeda | H01L 27/14603 348/222.1 |

* cited by examiner

*Primary Examiner* — Thanh T Nguyen
(74) *Attorney, Agent, or Firm* — Birch, Stewart, Kolasch & Birch, LLP (57) ABSTRACT

Embodiments of mechanisms for forming an image sensor device are provided. The image sensor device includes a semiconductor substrate and one photodetector formed in the semiconductor substrate. The image sensor device also includes one gate stack formed over the semiconductor substrate. The gate stack includes multiple polysilicon layers.

22 Claims, 8 Drawing Sheets

MECHANISMS FOR FORMING IMAGE SENSOR DEVICE

BACKGROUND

The semiconductor integrated circuit (IC) has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are needed.

Along with the advantages realized from reducing geometry size, improvements are being made directly to the IC devices. One such IC device is an image sensor device. An image sensor device includes a pixel array (or grid) for detecting light and recording an intensity (brightness) of the detected light. The pixel array responds to the light by accumulating a charge. The higher the intensity of the light is, the higher the charge is accumulated in the pixel array. The accumulated charge is then used (for example, by other circuitry) to provide image information for use in a suitable application, such as a digital camera.

However, since the feature sizes continue to decrease, fabrication processes continue to become more difficult to perform. Therefore, it is a challenge to form reliable image sensor devices with smaller and smaller sizes.

BRIEF DESCRIPTION OF THE DRAWINGS

For a more complete understanding of the embodiments, and the advantages thereof, reference is now made to the following descriptions taken in conjunction with the accompany drawings.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Figure 1:
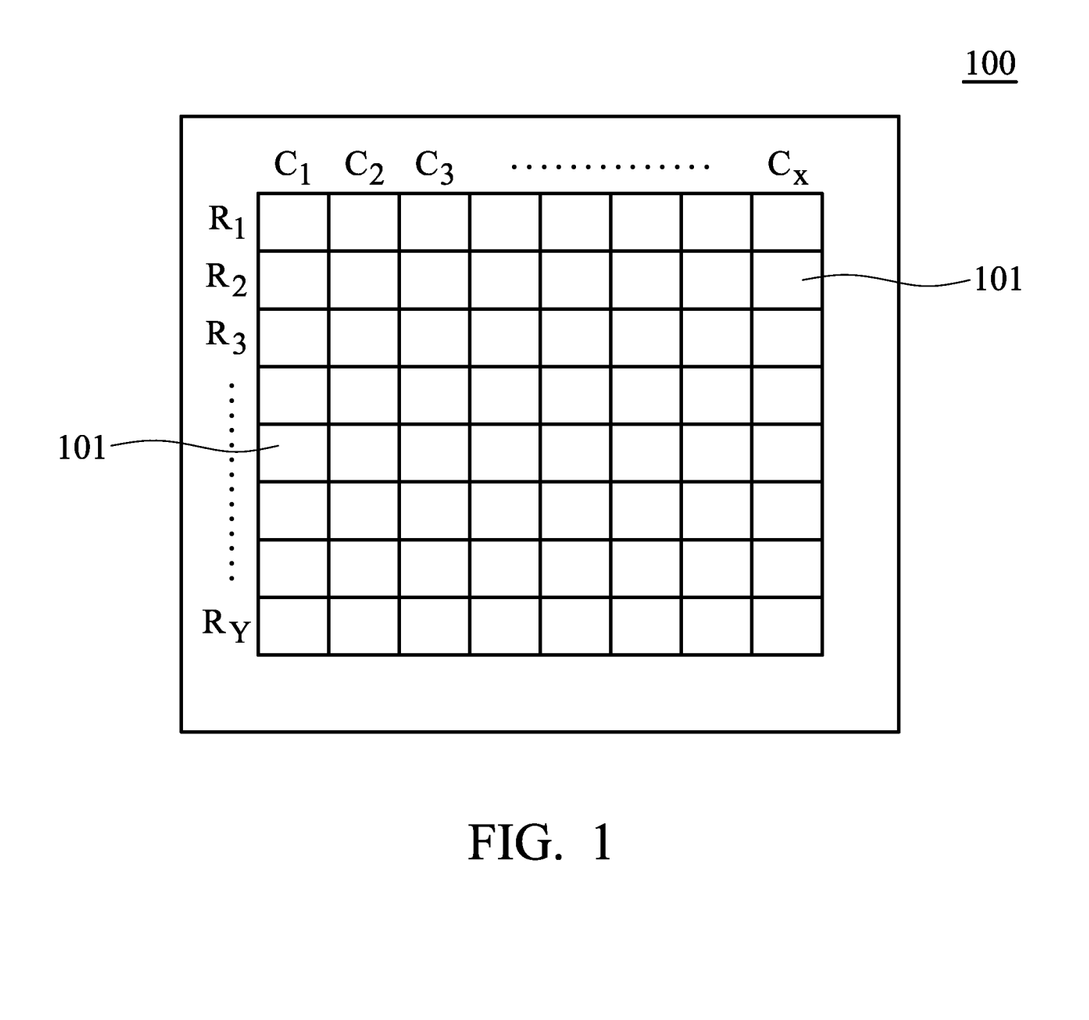
FIG. 1 is a top view of an image sensor device, in accordance with some embodiments.

Some variations of the embodiments are described. Throughout the various views and illustrative embodiments, like reference numbers are used to designate like elements. FIG. 1 is a top view of an image sensor device 100, in accordance with some embodiments. The image sensor device 100 may be a backside illuminated (BSI) image sensor device. However, it should be appreciated that embodiments of the disclosure are not limited thereto. In some other embodiments, the image sensor device 100 is a front side illuminated (FSI) image sensor device.

In some embodiments, the image sensor device 100 includes an array of pixel regions 101. The pixel regions 101 are arranged into a column (for example, $C_1$ to $C_X$) and a row (for example, $R_1$ to $R_Y$). The term "pixel region" refers to a unit cell containing features (for example, a photodetector and various circuitry). The unit cell may include various semiconductor devices for converting electromagnetic radiation into an electrical signal. Photodetectors in the pixel regions 101 may include photodiodes, complimentary metal-oxide-semiconductor (CMOS) image sensors, charged coupling device (CCD) sensors, active sensors, passive sensors, and/or other sensors.

The pixel regions 101 may be designed having various sensor types. One group of pixel regions 101 may be CMOS image sensors, and another group of pixel regions 101 may be other types of sensors, such as passive sensors. In some embodiments, each pixel region 101 includes a photodetector, such as a photogate-type photodetector, for recording an intensity or brightness of light (radiation). Each pixel region 101 may also include various semiconductor devices, such as various transistors.

Additional circuitry, inputs, and/or outputs may be formed in a periphery region of the image sensor device 100 and be coupled to the pixel regions 101. The circuitry in the periphery region provides an operation environment for the pixel regions 101 and support external communications with the pixel regions 101. For simplicity, an image sensor device including a single pixel region is described in the present disclosure.

Figure 2:
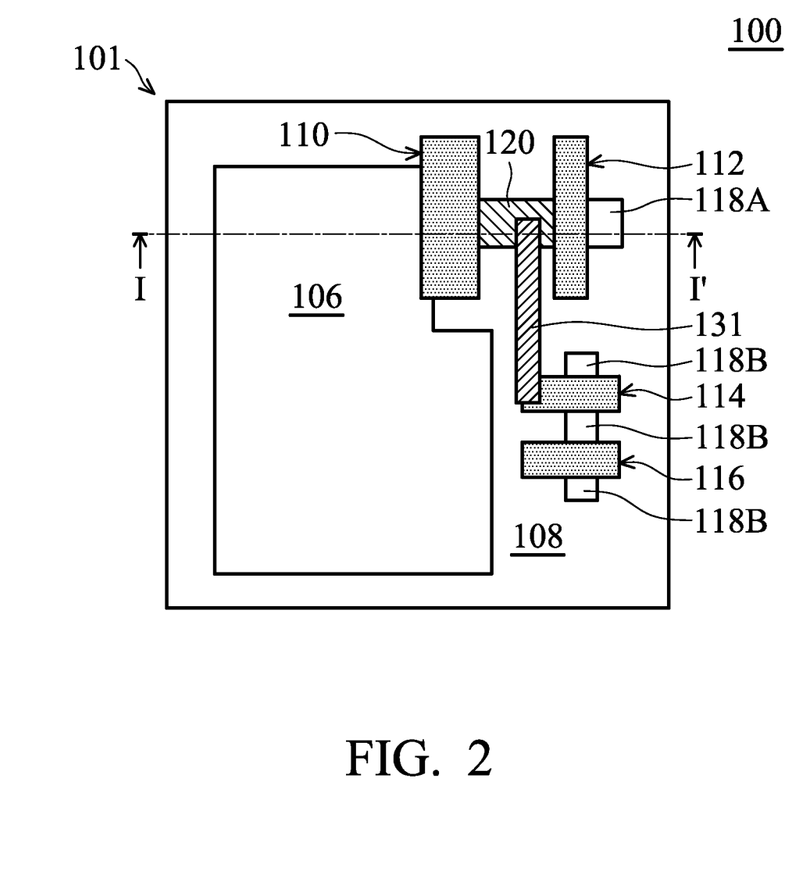
FIG. 2 is an enlarged top view of a pixel region in an image sensor device, in accordance with some embodiments.

FIG. 2 is an enlarged top view of one of the pixel regions 101 in the image sensor device 100 on a front surface of a semiconductor substrate (not illustrated in FIG. 2), in accordance with some embodiments. As shown in FIG. 2, the pixel region 101 includes a photodetector 106. In some embodiments, the photodetector 106 includes a photodiode for recording an intensity or brightness of light (radiation). The pixel region 101 may contain various transistors including a transfer transistor 110, a reset transistor 112, a source-follower transistor 114, a select transistor 116, or other suitable transistors, or combinations thereof.

The pixel region 101 may also include various doped regions in the semiconductor substrate, such as doped regions 118A, 118B, and 120. The doped regions 118A, 118B, and 120 serve as source/drain regions of the previously mentioned transistors. The doped region 120 is also referred as a floating diffusion region. The doped region 120 is between the transfer transistor 110 and the reset transistor 112, and is one of the source/drain regions for the transfer transistor 110 and the reset transistor 112. In some embodiments, a conductive feature 131 overlaps a portion of a gate stack of the source-follower transistor 114 and connects to the doped region 120.

The image sensor device 100 also includes various isolation structures 108 formed in the semiconductor substrate to isolate various regions of the semiconductor substrate. The isolation structures 108 prevent leakage currents between various regions. In some embodiments, the isolation structures 108 include dielectric isolation structures. The dielectric isolation structures may be formed by a shallow trench isolation (STI) technique, a deep trench isolation (DTI) technique, other applicable techniques, or combinations thereof.

In some embodiments, the isolation structures 108 may include doped isolation structures formed by an implantation technique or diffusion technique. In some embodiments, the isolation structure(s) 108 is/are formed in the pixel region 101 to isolate the photodetector 106, the transfer transistor 110, the reset transistor 112, the source-follower transistor 114, and the select transistor 116. The image sensor device 100 further includes a color filter (not shown) and a lens (not shown) disposed over a back surface of the semiconductor substrate. The color filter and the lens are aligned with the photodetector 106.

In operation of the image sensor device 100 according to some embodiments, the image sensor device 100 is designed to receive radiation traveling towards the back surface of the semiconductor substrate. The lens disposed over the back surface of the semiconductor substrate directs the incident radiation to the corresponding photodetector 106 in the semiconductor substrate. The incident radiation generates electron-hole pairs. When exposed to the incident radiation, the photodetector 106 responds to the incident radiation by accumulating electrons. The holes may be trapped by a doped layer over the back surface of the semiconductor substrate to prevent the re-combination of the electrons and the holes.

The electrons are transferred from the photodetector 106 to the doped region 120 when the transfer transistor 110 is turned on. Through the connection of the conductive feature 131, the source-follower transistor 114 may convert the electrons from the doped region 120 to voltage signals. The select transistor 116 may allow a single row (or a single column) of the pixel array to be read by read-out electronics. The reset transistor 112 may act as a switch to reset the doped region 120. When the reset transistor 112 is turned on, the doped region 120 is connected to a power supply to clear all accumulated electrons.

Figure 3:
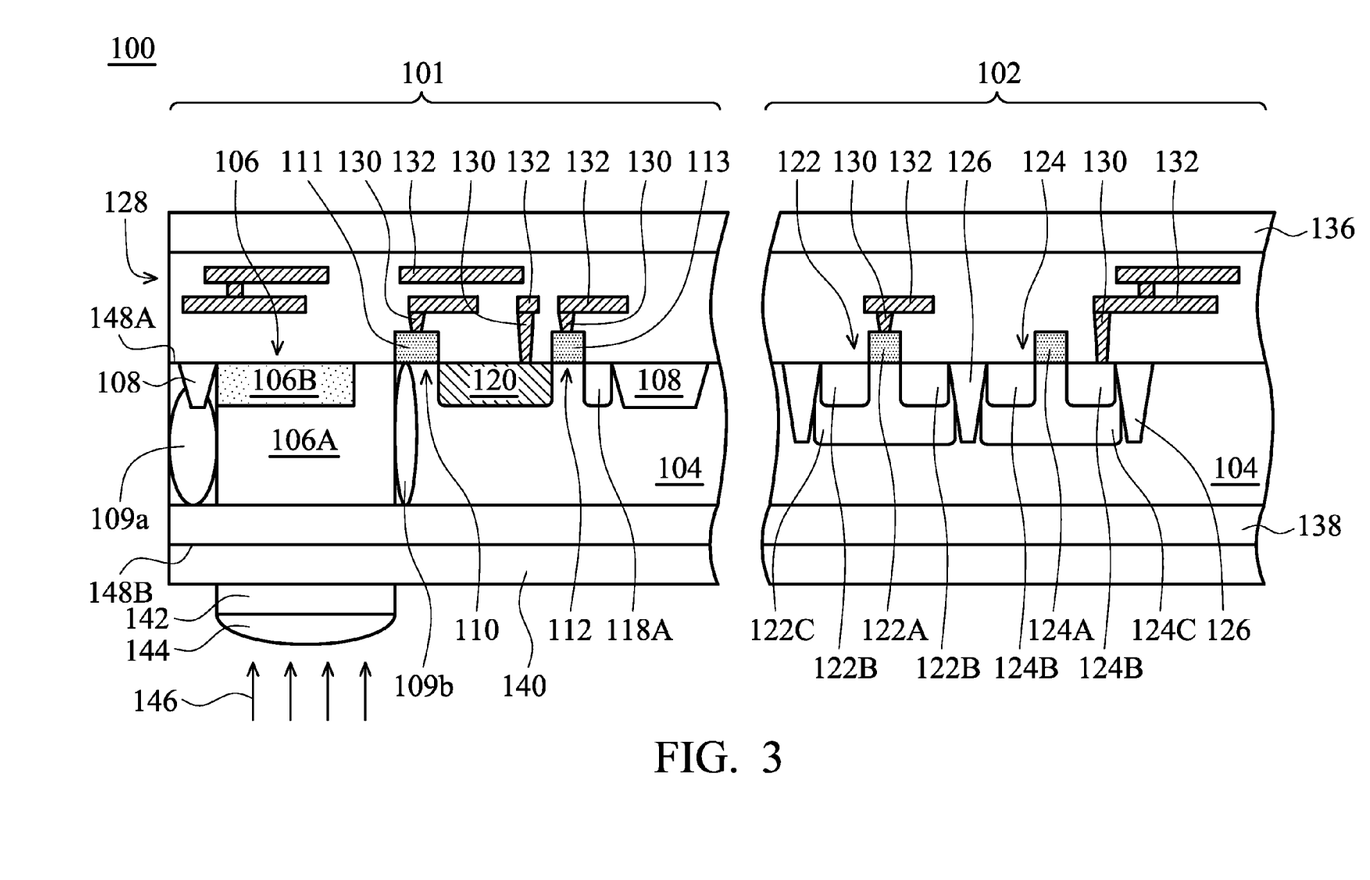
FIG. 3 is a cross-sectional view of the pixel region along line I-I' in FIG. 2 and a periphery region of the image sensor device, in accordance with some embodiments.

FIG. 3 is a cross-sectional view of the pixel region 101 along line A-A' in FIG. 2 and a periphery region 102 of the image sensor device 100, in accordance with some embodiments. The image sensor device 100 includes a semiconductor substrate 104 having a front surface 148A and a back surface 148B. In some embodiments, the semiconductor substrate 104 includes an epitaxially grown region.

In some embodiments, the semiconductor substrate 104 is a semiconductor substrate including silicon. Alternatively or additionally, the semiconductor substrate 104 is made of another elementary semiconductor material, such as germanium and/or diamond. The semiconductor substrate 104 may be made of a compound semiconductor, such as silicon carbide, gallium arsenic, gallium phosphide, indium phosphide, indium arsenide, and/or indium antimonide. In some embodiments, the semiconductor substrate 104 is made of an alloy semiconductor, such as SiGe, GaAsP, AlInAs, AlGaAs, GaInAs, GaInP, GaInAsP, or combinations thereof. The semiconductor substrate 104 may be a semiconductor on insulator (SOI).

In some embodiments, the semiconductor substrate 104 is a p-type doped substrate. P-type dopants, that the semiconductor substrate 104 is doped with, include boron, gallium, indium, other suitable p-type dopants, or combinations thereof. The semiconductor substrate 104 may alternatively be an n-type doped substrate. N-type dopants, that the semiconductor substrate 104 is doped with, include phosphorus, arsenic, other suitable n-type dopants, or combinations thereof. Doping may be implemented using a process, such as ion implantation or diffusion, in various operations and techniques. Following, a p-type doped substrate is taken as an example of the semiconductor substrate 104 for description.

As shown in FIG. 3, the pixel region 101 includes a photodetector 106. The photodetector 106 may be a photodiode that includes a light-sensing region 106A and a pinned layer 106B. The light-sensing region 106A is formed along the front surface 148A of the semiconductor substrate 104. In the depicted embodiments, the light-sensing region 106A is an n-type doped region. Accordingly, the pinned layer 106B is a p-type doped layer disposed overlapping the light-sensing region 106A at the front surface 148A of the semiconductor substrate 104. In some other embodiments, the light-sensing region 106A is a p-type doped region while the semiconductor substrate 104 is an n-type doped substrate.

In some embodiments, the pixel region 101 includes various transistors, such as the transfer transistor 110, the reset transistor 112, the source-follower transistor 114 (shown in FIG. 2), and the select transistor 116 (shown in FIG. 2). Each transistor has a corresponding gate stack formed over the front surface 148A of the semiconductor substrate 104. For example, the transfer transistor 110 has a gate stack 111, and the reset transistor 112 has a gate stack 113. The gate stack 111 of the transfer transistor 110 may overly a portion of the light-sensing region 106A.

The pixel region 101 also includes various doped regions in the semiconductor substrate 104. The doped regions correspond to gate stacks of the previous mentioned transistors as source/drain regions. For example, the doped regions 120 and 118A are source/drain regions of the reset transistor 112. As mentioned above, the doped region 120 is also referred as the floating diffusion region. The doped region 120 is between the transfer transistor 110 and the reset transistor 112. The gate stack 111 of the transfer gate 110 interposes the doped region 120 and the light-sensing region 106A. Therefore, a channel is defined between the doped region 120 and the light-sensing region 106A. The doped region 120 may convert the accumulated charges from the photodetector 106 to voltage signals for the source-follower transistor 114 (shown in FIG. 2). In the depicted embodiment, the doped region 120 is an n-type doped region.

The gate stack of each transistor includes a gate dielectric layer and a gate electrode layer (not shown in FIG. 3). The gate dielectric layer may be made of a dielectric material, such as silicon oxide, a high-k dielectric material, other dielectric material, or combinations thereof. Examples of the high-k dielectric material include $HfO_2$, HfSiO, HfSiON, HfTaO, HfSiO, HfZrO, zirconium oxide, aluminum oxide, hafnium dioxide-alumina (HfO$_2$—Al$_2$O$_3$) alloy, or combinations thereof.

In some embodiments, the gate electrode layer includes multiple semiconductor layers, such as polysilicon layers. Studies show that dark current and noise (such as the random telegraph signal, RTS) are greatly reduced if the gate electrode layer includes multiple semiconductor layers, such as polysilicon layers. For example, the dark current is reduced to more than about 16% when compared to an image sensor device having a single layered polysilicon gate electrode. The forming and the structure of the gate electrode layer, including multiple polysilicon layers, will be described in more detail later.

Referring back to FIG. 3, the periphery region 102 may include readout circuitry and/or control circuitry coupled to the pixel region 101 to provide an operational environment for the pixel region 101. As shown in FIG. 3, a PMOS transistor 122 and a NMOS transistor 124 are formed in the periphery region 102, in accordance with some embodiments. The PMOS transistor 122 includes a gate stack 122A and source/drain regions 122B formed in an n-type well 122C. The NMOS transistor 124 includes a gate stack 124A and source/drain regions 124B formed in a p-type well 124C.

In some embodiments, the image sensor device 100 further includes a number of isolation structures 126 and the isolation structures 108. The isolation structures 126 are formed in the semiconductor substrate 104 of the periphery region 102. The isolation structures 108 are formed in the semiconductor substrate 104 of the pixel region 101. The isolation structures 126 and the isolation structures 108 isolate various regions of the semiconductor substrate 104.

In some embodiments, the isolation structures 126 isolate the PMOS transistor 122 and the NMOS transistor 124. The isolation structures 108 isolate the photodetector 106, the transfer transistor 110, the reset transistor 112, the source-follower transistor 114 (shown in FIG. 2) and the select transistor 116 (shown in FIG. 2). The isolation structures 126 and the isolation structures 108 include silicon oxide, silicon nitride, silicon oxynitride, other insulating material, or combinations thereof. In some embodiments, the isolation structures 126 are deeper than the isolation structures 108.

As shown in FIG. 3, the image sensor device 100 includes a number of isolation regions, such as isolation regions 109a and 109b, formed in the semiconductor substrate 100, in accordance with some embodiments. In some embodiments, the isolation regions 109a and 109b are formed by using an ion implantation process. The isolation regions 109a and 109b may be p-type doped regions and surround the light-sensing region 106A. In some embodiments, the doping concentration of the isolation regions 109a and 109b is in a range from about $10^{17}$ atoms/cm$^3$ to about $10^{19}$ atoms/cm$^3$. The isolation regions 109a and 109b surround the light-sensing region 106A. The isolation regions may improve the sensitivity of the image sensor device and reduce cross-talk.

As shown in FIG. 3, the image sensor device 100 further includes a multilayer interconnect (MLI) 128 formed over the front surface 148A of the semiconductor substrate 104. The MLI 128 is coupled to various components of the image sensor device 100, such as the photodetector 106. Therefore, the various components of the image sensor device 100 are operable to properly respond to illuminated light (imaging radiation).

The MLI 128 includes various conductive features, which may be vertical interconnects 130, such as contacts and/or vias, and horizontal interconnects 132, such as lines. The interconnect 132 may includes the conductive feature 131 as shown in FIG. 2. The various interconnects 130 and 132 are made of conductive materials, such as aluminum, copper, titanium, titanium nitride, tungsten, polysilicon, metal silicide, other applicable materials, or combinations thereof.

The interconnects 130 and 132 of the MLI 128 are embedded in an interlayer dielectric (ILD) structure 134. The ILD structure 134 may have a multilayer structure. The ILD structure 134 may be made of silicon oxide, silicon nitride, silicon oxynitride, tetraethylorthosilicate (TEOS) oxide, phosphosilicate glass (PSG), borophosphosilicate glass (BPSG), fluorinated silica glass (FSG), carbon doped silicon oxide, amorphous fluorinated carbon, low-k dielectric material, polyimide, other suitable materials, or combinations thereof.

A carrier wafer 136 is disposed over the front surface 148A of the semiconductor substrate 104. In some embodiments, the carrier wafer 136 is bonded to the MLI 128. The carrier wafer 136 may be made of a semiconductor material, such as silicon, or glass. The carrier wafer 136 may provide protection for the various features (such as the photodetector 106) formed on the front surface 148A of the semiconductor substrate 104. The carrier wafer 136 may also provide mechanical strength and support for processing the back surface 148B of the semiconductor substrate 104. For example, the carrier wafer 136 may serve as a support substrate, and a thinning process is performed to the back surface 148B to thin down the semiconductor substrate 104. The semiconductor substrate 104 may be thinned by using a chemical mechanical polishing (CMP) process, an etching process, or other applicable processes.

In some embodiments, the image sensor device 100 includes a doped layer 138 formed at the back surface 104B of the semiconductor substrate 104. The doped layer 138 may repair the back surface 148B damaged during the thinning process on the back surface 148B to reduce dark current and white pixels. The doped layer 138 may be formed by using an implantation process, diffusion process, annealing process, or combinations thereof. In some embodiments, the doped layer 138 is p-type doped. The doped layer 138 extends into the semiconductor substrate 104 from the back surface 104B of the semiconductor substrate 104.

As shown in FIG. 3, the image sensor device 100 includes an antireflective layer 140, a filter 142 (such as a color filter), and a lens 144 formed over the back surface 148B, in accordance with some embodiments. The antireflective layer 140 may be made of a dielectric material, such as silicon nitride, silicon oxynitride, other applicable materials, or combinations thereof.

The filter 142 is formed over the antireflective layer 140, and is aligned with the light-sensing region 106A of the photodetector 106, in accordance with some embodiments. The filter 142 is designed so that it filters through light of a predetermined wavelength. For example, the filter 142 may filter through visible light of a red wavelength, a green wavelength, or a blue wavelength to the photodetector 106. In some embodiments, the filter 142 is made of a dye-based (or pigment-based) polymer for filtering out a specific frequency band (for example, a desired wavelength of light).

The lens 144 is disposed over the filter 142 and is also aligned with the light-sensing region 106A of the photodetector 106, in accordance with some embodiments. The lens 144 may be in various positional arrangements with the photodetector 106 and filter 142, such that the lens 144 focuses an incident radiation 146 on the light-sensing region 106A of the photodetector 106. Alternatively, the position of the color filter layer 142 and the lens 144 may be reversed, such that the lens 144 is disposed between the antireflective layer 140 and filter 142.

In an operation according to some embodiments, the image sensor device 100 is designed to receive a radiation 146 traveling towards the back surface 148B of the semiconductor substrate 104. The lens 144 directs the incident radiation 146 to the filter 142. The incident radiation 146 then passes from the filter 142 through the antireflective layer 140 to the semiconductor substrate 104 and the corresponding photodetector 106, specifically to light-sensing region 106A.

When exposed to the incident radiation 146, the photodetector 106 responds to the incident radiation 146 by generating electron-hole pairs and accumulating charges. When the gate of transfer transistor 110 is turned on, the charges are transferred from the photodetector 106 to the doped region 120. Through the connection of the conductive feature 132 (shown in FIG. 2), the source-follower transistor 114 may convert the charges from the doped region 120 to voltage signals. The select transistor 116 may allow a single row (or a single column) of the pixel array to be read by read-out electronics. The reset transistor 112 may act as a switch to reset the doped region 120. When the reset transistor 112 is turned on, the doped region 120 is effectively connected to a power supply to clear all integrated charges.

Figure 4A:
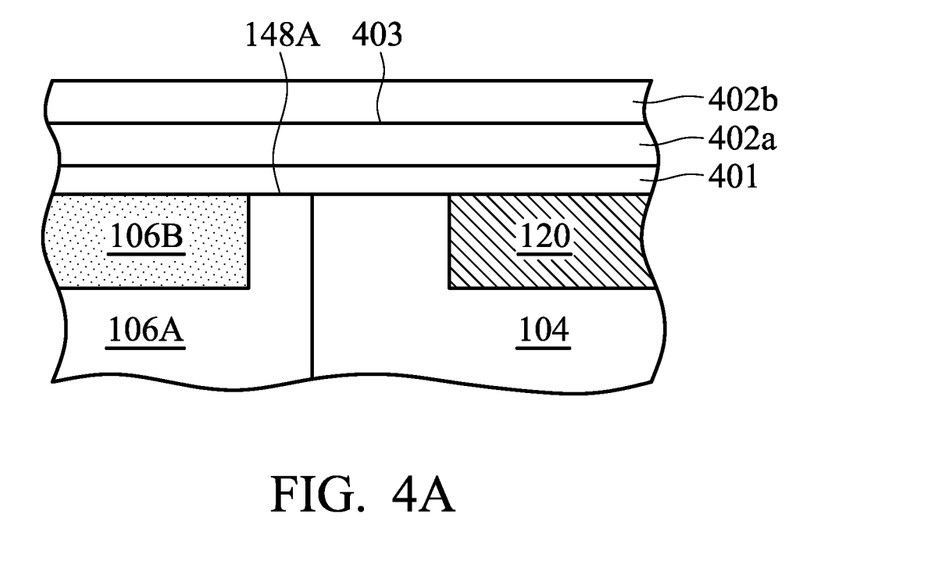
FIGS. 4A-4C are enlarged cross-sectional views of various stages of a process for forming a gate stack of an image sensor device, in accordance with some embodiments.
Figure 4B:
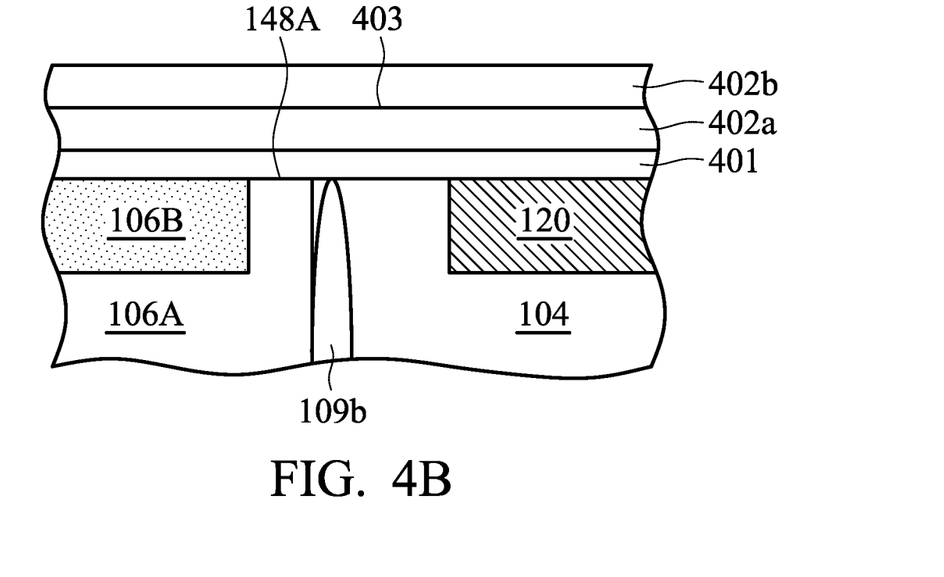
Figure 4C:
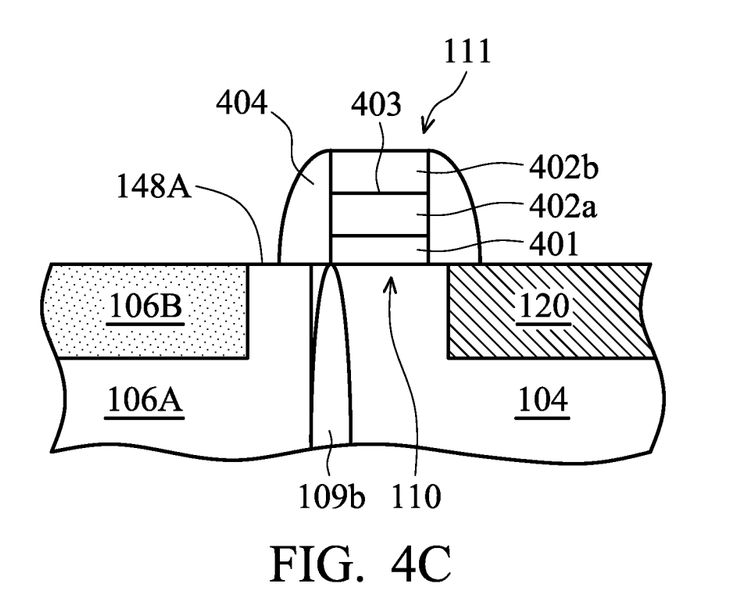

As mentioned above, the dark current and noise are greatly reduced if the gate electrode layer of the image sensor device 100 includes multiple polysilicon layers. FIGS. 4A-4C are enlarged cross-sectional views of various stages of a process for forming the gate stack of the image sensor device, in accordance with some embodiments.

As shown in FIG. 4A, a gate dielectric layer 401 is deposited over the front surface 148A of the semiconductor substrate 104, in accordance with some embodiments. In some embodiments, the gate dielectric layer 401 is deposited after the light-sensing region 106A, the pinned layer 106B, and the doped region 120 are formed. In some other embodiments, some or all of the light-sensing region 106A, the pinned layer 106B, and the doped region 120 are formed after the gate dielectric layer 401 is deposited. The gate dielectric layer 401 may be made of the dielectric material mentioned above. The gate dielectric layer 401 may be deposited by using a CVD process, PVD process, thermal oxidation process, other applicable processes, or combinations thereof.

As shown in FIG. 4A, multiple semiconductor layers, such as polysilicon layers 402a and 402b, are deposited over the gate dielectric layer 401, in accordance with some embodiments. In some embodiments, the polysilicon layers 402a and 402b are sequentially deposited. In some embodiments, the polysilicon layer 402a is deposited by using a CVD process or other applicable processes.

Figure 6A:
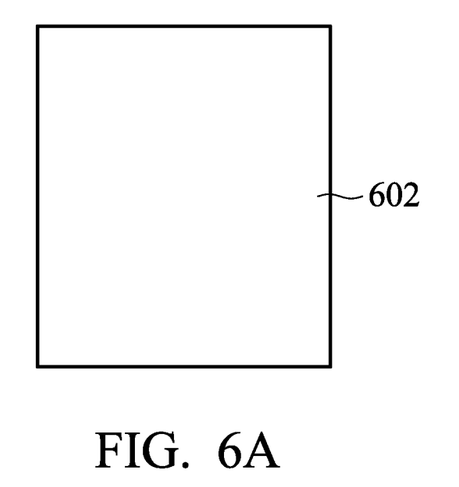
FIGS. 6A and 6B are cross-sectional views of a furnace and a chamber respectively used for forming polysilicon layers of an image sensor device, in accordance with some embodiments.
Figure 6B:
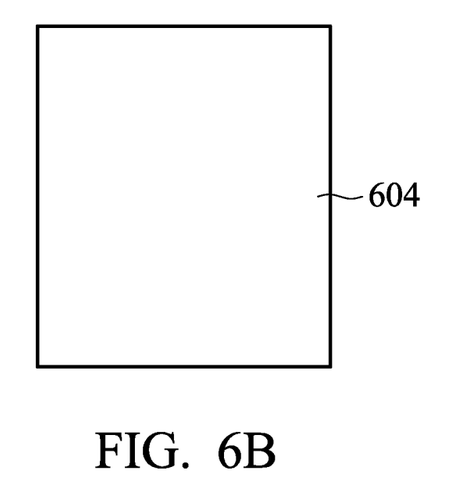

FIGS. 6A and 6B are cross-sectional views of a furnace 602 and a chamber 604 respectively used for forming the polysilicon layers of the image sensor device 100, in accordance with some embodiments. In some embodiments, the deposition process of the polysilicon layer 402a may be carried out in the furnace 602. The deposition process may be performed at a temperature ranging from about 500° C. to about 800° C. A silicon source gas, such as silane ($SiH_4$), disilane ($Si_2H_6$), trisilane ($Si_3H_8$), dichlorosilane ($SiH_2Cl_2$), other applicable silicon source gases, or combinations thereof, may be used in the furnace 602 to form the polysilicon layer 402a. In some embodiments, a number of wafers are disposed into the furnace 602 to simultaneously deposit the polysilicon layer over each of the wafers.

Afterwards, the semiconductor substrate 104 is removed from the furnace 602 and disposed into a chamber 604. The deposition process of the polysilicon layers is temporarily stopped. The chamber 604 contains an inert gas, such as helium, argon, or the like, in accordance with some embodiments. In some embodiments, the chamber 604 contains nitrogen gas. In some embodiments, the chamber 604 contains air. In some embodiments, a thin native oxide layer or the like is grown on a surface of the polysilicon layer 402a.

Afterwards, the semiconductor substrate 104 is disposed into the furnace 602 again to deposit the polysilicon layer 402b over the polysilicon layer 402a. In some embodiments, an interface 403 is formed between the polysilicon layers 402a and 402b. The interface 403 may be observed by using an electron microscope, such as a TEM. The processes mentioned above may be repeatedly performed to form more polysilicon layers over the polysilicon layer 402b.

Due to the interface 403, the grain growth in the polysilicon layers 402a and 402b are limited and suppressed. As a result, an average grain size of the polysilicon layers 402a and 402b are small when compared to an average grain size of a single layered polysilicon layer. In some embodiments, an average grain size of one of the polysilicon layers 402a and 402b is in a range from about 3 nm to about 12 nm. In some other embodiments, the average grain size of one of the polysilicon layers 402a and 402b is in a range from about 4 nm to about 8 nm. The average grain size of the polysilicon layer may be adjustable by tuning the thickness of the polysilicon layer. In some embodiments, a ratio of the average grain size of the polysilicon layer to the thickness of the polysilicon layer is in a range from about 0.03 to about 0.4. In some embodiments, the average grain size of the polysilicon layer 402a is different from that of the polysilicon layer 402b.

As shown in FIG. 4B, an implantation process is performed over the polysilicon layer 402b to form isolation regions, including the isolation region 109b and the isolation region 109a (shown in FIG. 3 but not shown in FIG. 4B). In some embodiments, multiple implantation operations are performed to form the isolation region 109b. For example, an implantation operation with lower implantation energy is used to form the portion of the isolation region 109b near the front surface 148A. An implantation operation with higher implantation energy is used to form the portion of the isolation region 109b near the back surface 148B (not shown in FIG. 4B). A number of ion implantation operations are performed to form the isolation region 109b along a sidewall of the light-sensing region 106A.

As shown in FIG. 4C, the gate dielectric layer 401 and the polysilicon layers 402a and 402b are patterned to form multiple gate stacks over the semiconductor substrate 100, in accordance with some embodiments. As shown in FIG. 4C, only the gate stack 111 of the transfer transistor 110 is shown. It should be appreciated that other gate stacks, such as gate stacks 113, 122A, and 124A, may also be formed in the same patterning process. In some embodiments, spacers 404 are formed along sidewalls of the gate stacks. Referring to FIGS. 2 and 3, each of the illustrated transistors may have a similar (or the same) gate stack as shown in FIG. 4C.

As mentioned above, studies show that the dark current and noise are greatly reduced if the gate electrode layer includes multiple polysilicon layers. The reasons, why the dark current and noise are reduced, are not clear. It may due to the increase of the numbers of interface(s) and grain boundaries of the polysilicon layer. The travelling of the implanted ions may therefore be limited during the implantation process for forming the isolation regions surrounding the light-sensing region 106A. Therefore, the implanted ions are substantially limited to the intended region without traveling to regions not desired. The isolation region, such as the isolation region 109b, includes a sufficient amount of p-type dopant since the implanted ions stay in the desired regions. Therefore, the dark current and noise are greatly reduced. However, it should be appreciated that other reasons may result in the improved performance of the image sensor device 100.

Embodiments of the disclosure may have many variations. Some of the variations are described below. FIGS. 5A-5D are enlarged cross-sectional views of the gate stacks of the transistors of the image sensor device, in accordance with some embodiments.

Figure 5A:
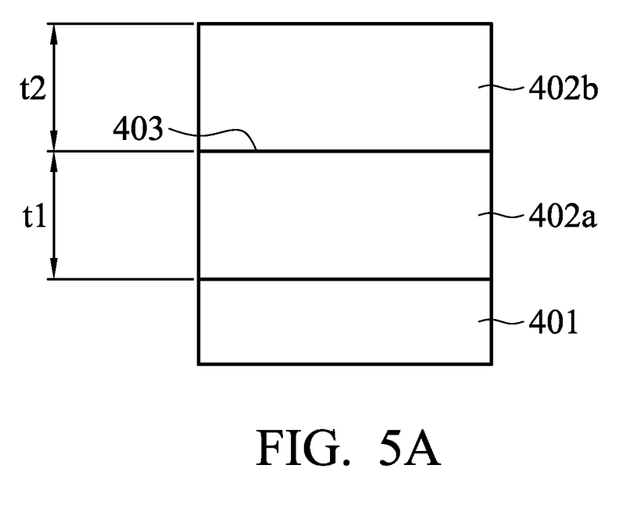
FIGS. 5A-5D are enlarged cross-sectional views of gate stacks of transistors of an image sensor device, in accordance with some embodiments.

As shown in FIG. 5A, the gate stack includes the two polysilicon layers 402a and 402b, in accordance with some embodiments. The interface 403 is formed between the polysilicon layers 402a and 402b. The polysilicon layer 402a has a thickness $t_1$, and the polysilicon layer 402b has a thickness $t_2$. In some embodiments, the thickness $t_1$ and the thickness $t_2$ are substantially the same. For example, the thickness $t_1$ of the polysilicon layer 402a is in a range from about 300Å to about 800Å. In some embodiments, the thicknesses of the polysilicon layers 402a and 402b are substantially the same. The average grain size of the polysilicon layer 402a may be larger than that of the polysilicon layer 402b.

Figure 5B:
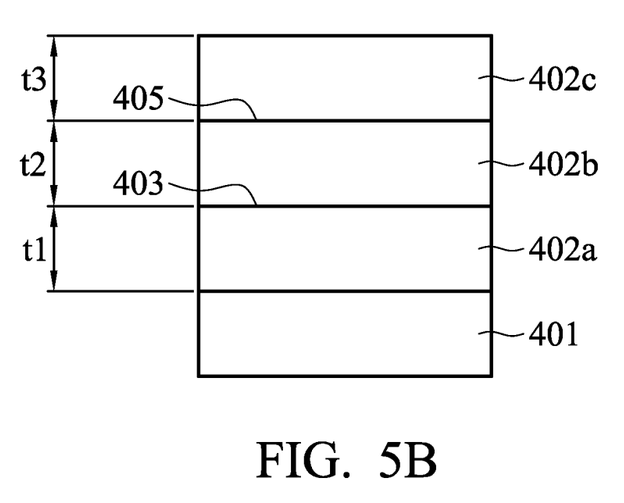

The number of the polysilicon layers of the gate stack is not limited to be two. As shown in FIG. 5B, the gate stack includes three (or more) polysilicon layers 402a, 402b, and 402c, in accordance with some embodiments. The interface 403 is formed between the polysilicon layers 402a and 402b, and an interface 405 is formed between the polysilicon layers 402b and 402c. The polysilicon layer 402c has a thickness $t_3$. In some embodiments, the thicknesses $t_1$, $t_2$, and $t_3$ are substantially the same. In some embodiments, the average grain size of the polysilicon layer 402a is larger than that of the polysilicon layer 402c. In some embodiments, the polysilicon layer, which is adjacent to the gate dielectric layer 401, has the largest average grain size.

Figure 5C:
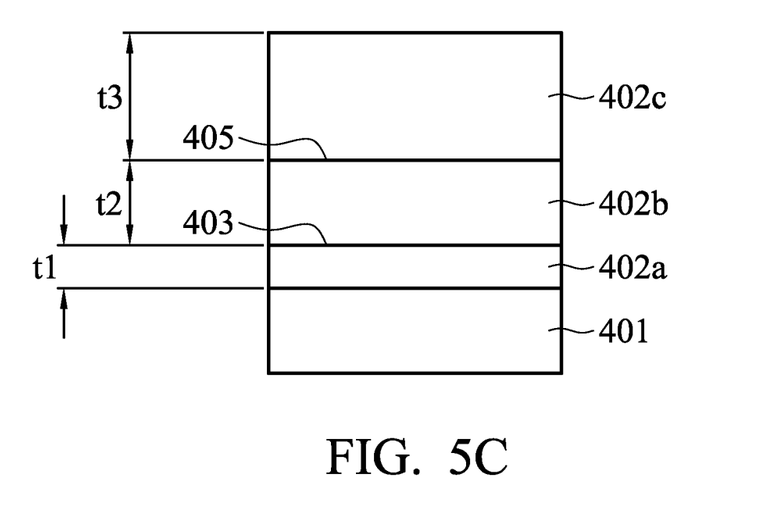

The thicknesses of the multiple polysilicon layers of the gate stack are not limited to be the same. As shown in FIG. 5C, the thicknesses $t_1$, $t_2$, and $t_3$ are different from each other, in accordance with some embodiments. In some embodiments, the thickness $t_3$ of the polysilicon layer 402c is greater than the thickness $t_2$ of the polysilicon layer 402b. In some embodiments, the average grain size of the polysilicon layer 402c is larger than that of the polysilicon layer 402b, which is thinner than the polysilicon layer 402c. In some embodiments, the thickness $t_2$ of the polysilicon layer 402b is greater than the thickness $t_1$ of the polysilicon layer 402a. In some embodiments, the average grain size of the polysilicon layer 402b is larger than that of the polysilicon layer 402a, which is thinner than the polysilicon layer 402b.

Figure 5D:
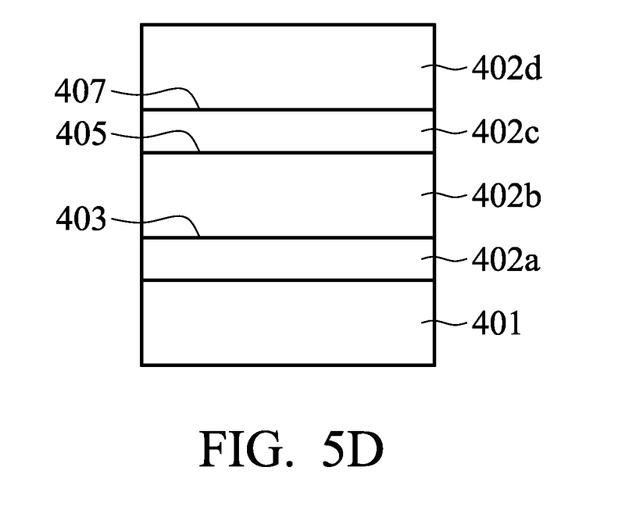

As shown in FIG. 5D, more polysilicon layers, such as the polysilicon layers 402a, 402b, 402c, and 402d are formed, in accordance with some embodiments. An interface 407 is formed between the polysilicon layers 402d and 402c. The thicknesses of the polysilicon layers 402a, 402b, 402c, and 402d may be different from each other. In some embodiments, the thicknesses of some of the polysilicon layers 402a, 402b, 402c, and 402d are the same. In some other embodiments, the thicknesses of the polysilicon layers 402a, 402b, 402c, and 402d are substantially the same. In some embodiments, the average grain sizes of the polysilicon layers are different from each other.

Embodiments of mechanisms for forming an image sensor device described above form gate stacks each including multiple polysilicon layers. By forming multiple polysilicon layers, each of the gate stacks has more interfaces formed between the multiple polysilicon layers. The grain growth in each of the polysilicon layers are restrained and limited due to the interfaces. As a result, each of the polysilicon layers has a smaller average grain size. The dark current and noise are greatly reduced, which may be due to the effect of the multiple polysilicon layers.

In accordance with some embodiments, an image sensor device is provided. The image sensor device includes a semiconductor substrate and one photodetector formed in the semiconductor substrate. The image sensor device also includes one gate stack formed over the semiconductor substrate. The gate stack includes multiple polysilicon layers.

In accordance with some embodiments, an image sensor device is provided. The image sensor device includes a semiconductor substrate and a light-sensing region formed in the semiconductor substrate. The image sensor device also includes a floating diffusion region formed in the semiconductor substrate. The image sensor device further includes a gate stack interposing the light-sensing region and the floating diffusion region, and the gate stack comprises a stack of a number of semiconductor layers.

In accordance with some embodiments, a method for forming an image sensor device is provided. The method includes providing a semiconductor substrate and forming a photodetector in the semiconductor substrate. The method also includes depositing a gate dielectric layer over the semiconductor substrate and depositing a number of polysilicon layers over the gate dielectric layer. The method further includes patterning the gate dielectric layer and the polysilicon layers to form at least one gate stack over the semiconductor substrate.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An image sensor device, comprising:
   a semiconductor substrate;
   at least one photodetector formed in the semiconductor substrate;
   isolation regions surrounding the photodetector; and
   at least one gate stack formed over the semiconductor substrate, wherein the at least one gate stack comprises a plurality of polysilicon layers, and the polysilicon layers together form a gate electrode of a transistor.

2. The image sensor device as claimed in claim 1, further comprising at least one interface formed between the polysilicon layers.

3. The image sensor device as claimed in claim 1, wherein an average grain size of one of the polysilicon layers is in a range from about 3 nm to about 12 nm.

4. The image sensor device as claimed in claim 1, wherein thicknesses of the polysilicon layers are substantially the same.

5. The image sensor device as claimed in claim 1, wherein thicknesses of the polysilicon layers are different from each other.

6. The image sensor device as claimed in claim 1, wherein thicknesses of some of the polysilicon layers are different from each other.

7. The image sensor device as claimed in claim 1, wherein average grain sizes of the polysilicon layers are different from each other.

8. The image sensor device as claimed in claim 1, wherein average grain sizes of the polysilicon layers are substantially the same.

9. The image sensor device as claimed in claim 1, wherein a ratio of an average grain size of one of the polysilicon layers to a thickness of the corresponding one of the polysilicon layers is in a range from about 0.03 to about 0.4.

10. The image sensor device as claimed in claim 1, wherein the photodetector comprises a light-sensing region, the light-sensing region is an n-type doped region, and the isolation regions are p-type doped regions, and a part of the isolation regions is directly below the at least one gate stack.

11. The image sensor device as claimed in claim 1, wherein two of the polysilicon layers are in direct contact with each other.

12. An image sensor device, comprising:
a semiconductor substrate;
a light-sensing region formed in the semiconductor substrate;
a floating diffusion region formed in the semiconductor substrate;
isolation regions surrounding the light-sensing region; and
a gate stack interposing the light-sensing region and the floating diffusion region, wherein the gate stack comprises a stack of a plurality of semiconductor layers, and the semiconductor layers together form a gate electrode of a transistor.

13. The image sensor device as claimed in claim 12, wherein the semiconductor layers are polysilicon layers.

14. The image sensor device as claimed in claim 12, an average grain size of one of the semiconductor layers is in a range from about 3 nm to about 12 nm.

15. The image sensor device as claimed in claim 12, wherein a ratio of an average grain size of one of the semiconductor layers to a thickness of the corresponding one of the polysilicon layers is in a range from about 0.03 to about 0.4.

16. The image sensor device as claimed in claim 12, wherein thicknesses of the semiconductor layers are substantially the same.

17. The image sensor device as claimed in claim 12, wherein thicknesses of the semiconductor layers are different from each other.

18. The image sensor device as claimed in claim 12, wherein thicknesses of some of the semiconductor layers are different from each other.

19. The image sensor device as claimed in claim 12, wherein average grain sizes of the semiconductor layers are different from each other.

20. The image sensor device as claimed in claim 12, wherein average grain sizes of the semiconductor layers are substantially the same.

21. The image sensor as claimed in claim 12, further comprising a pinned layer on the light sensing region, wherein the pinned layer and the light sensing region form a photodetector, a portion of the light sensing region is between the pinned layer and the floating diffusion region, and the pinned layer has a conductivity type different from that of the light sensing region and that of the floating diffusion region.

22. The image sensor device as claimed in claim 12, wherein a part of the isolation regions is directly below the gate stack.

* * * * *